United States Patent [19]

Collins

[11] Patent Number: 5,557,234
[45] Date of Patent: Sep. 17, 1996

[54] DIFFERENTIAL AMPLIFIER WITH MISMATCH CORRECTION USING FLOATING GATES

[75] Inventor: Stephen Collins, Worcester, United Kingdom

[73] Assignee: The Secretary of State for Defence in Her Britannic Majesty's Government of the United Kingdom of Great Britain and Northern Ireland, London, England

[21] Appl. No.: 347,482

[22] PCT Filed: Feb. 15, 1993

[86] PCT No.: PCT/GB93/00311

§ 371 Date: Mar. 8, 1995

§ 102(e) Date: Mar. 8, 1995

[87] PCT Pub. No.: WO93/17493

PCT Pub. Date: Sep. 2, 1993

[30] Foreign Application Priority Data

Feb. 27, 1992 [GB] United Kingdom ............... 9204434

[51] Int. Cl.[6] ........................................ H03F 3/45
[52] U.S. Cl. ................ 327/563; 327/562; 327/52; 365/185.21; 365/185.14; 330/253
[58] Field of Search .................. 330/253; 327/563, 327/562, 561, 560, 53, 52, 51; 365/185, 189.09, 185.21, 185.14

[56] References Cited

U.S. PATENT DOCUMENTS

| | | | |
|---|---|---|---|
| 5,109,261 | 4/1992 | Mead et al. | 257/369 |
| 5,430,670 | 7/1995 | Rosenthal | 365/185.03 |
| 5,442,583 | 8/1995 | Kirk et al. | 364/841 |

OTHER PUBLICATIONS

Säckinger et al.; "An Analog Trimming Circuit Based On A Floating-Gate Device"; IEEE Journal of Solid-State Circuits, vol. 23, No. 6, Dec. 1988; pp. 1437–1440.

Carley; "Trimming Analog Circuits Using Floating-Gate Analog MOS Memory"; IEEE Journal of Solid-State Circuits, vol. 24, No. 6, Dec. 1989; pp. 1569–1575.

Thomsen et al.; "A Floating-Gate MOSFET With Tunneling Injector Fabricated Using A Standard Double-Polysilicon CMOS Process"; IEEE Electron Device Letters, vol. 12, No. 3, Mar. 1991; pp. 111–113.

S. M. Sze; "Physics of Semiconductor Devices"; 2nd Ed., Wiley 1981, p. 496.

Gray et al.; "Analysis And Design Of Analog Integrated Circuits"; Second Edition, John Wiley & Cons, 1984; pp. 744–745.

*Primary Examiner*—Timothy P. Callahan
*Assistant Examiner*—Terry L. Englund
*Attorney, Agent, or Firm*—Nixon & Vanderhye P.C.

[57] ABSTRACT

Differential amplifier (10) incorporates five metal oxide field effect transistors (MOSFETs) (M1 to M5). The transistors (M1 to M5) are a source-coupled pair of input transistors (M1, M2) with sources connected to a current control transistor (M5) and having respective drain load transistors (M3, M4). The transistors (M1 to M5) have floating gates (F1 to F5) and input gates (G1 to G5). The amplifier (10) is adjusted to counteract differing input transistor threshold voltage by charging one of the input transistor floating gates (G1, G2) to reduce amplifier offset voltage extrapolated to zero input transistor drain current. It is then adjusted to reduce discrepancies between actual and design values of input transistor drain voltage by charging one or both of the drain load transistor floating gates (F3, F4). The amplifier may be arranged as an operational amplifier (20) with a second state (16) connected to an input transistor drain. The operational amplifier input offset voltage is determined by comparing the second stage output with a reference and feeding a resulting differences signal to the amplifier input. The input offset voltage is then counteracted by charging an input transistor floating gate (F1 or F2) to reduce the difference signal.

15 Claims, 3 Drawing Sheets

DIFFERENTIAL AMPLIFIER WITH MISMATCH CORRECTION USING FLOATING GATES

BACKGROUND OF THE INVENTION

1. Field of the Invention

This invention relates to a differential amplifier and to a method of obtaining an imbalance-corrected differential amplifier.

2. Discussion of Prior Art

Differential amplifiers are well known in the prior art. They are based on the so-called long-tailed pair of active three terminal devices. The devices of such a pair have separate input and load connections, but their third terminals are connected together; ie the pair may be a cathode-coupled valve pair, an emitter-coupled bipolar transistor pair or a source-coupled field effect transistor pair. More complex circuits are also known in which a differential amplifier is an input stage of an operational amplifier, and converts two input signals to a single differential signal. In recent years, differential and operational amplifier production has been preferentially based on integrated circuit techniques using complementary metal oxide-silicon (CMOS) technology.

An ideal differential amplifier would have a predetermined output voltage for zero input voltages. It would also have a predetermined output voltage when both input voltages are non-zero but equal; ie the common mode rejection ratio (CMRR) of the amplifier should be infinite. In practice, this ideal is not achieved because of mis-match between component transistors of a differential amplifier.

A differential amplifier has at least one pair of transistors which should ideally be identical. Unfortunately, variations in manufacturing lead to differences between pair members which produce discrepancies between ideal performance and obtained performance.

To improve differential amplifier performance over that obtainable by attention to design and manufacture, it is known to adjust the physical parameters of such amplifiers subsequent to manufacture. One such approach involves incorporating in the amplifier a resistor whose value controls an electrical characteristic of the amplifier. The resistor is made of vaporizable material, and is located in an accessible position in the amplifier. The resistor is partially vaporized by a laser to alter its resistance to a value appropriate to adjust the amplifier's performance. In practice, a circuit requires robust construction and therefore increased cost to tolerate thermal stresses associated with laser vaporization. Moreover, to achieve adequate performance, it may be necessary to employ more than one vaporizable resistor. The process is limited in accuracy to the minimum change in a resistor value obtainable by a single laser pulse, and is time consuming and expensive.

An alternative approach to differential amplifier adjustment is to replace individual resistors requiring adjustment by respective chains of resistors in series, each resistor being bridged by a Zener diode with associated current terminal pad. One or more individual resistors in each chain may be short-circuited by passing a high reverse current through the associated Zener diodes. The current short-circuits the diode junction, and the chain resistance becomes that due to those remaining resistors which are not short-circuited. Conveniently, the resistor values in a chain form a binary doubling sequence, ie R, 2R, . . . $2^{n-1}R$; seven resistors per chain are needed to achieve resistance adjustment accuracy to 1% of the chain resistance. Moreover, each resistor requires a contact pad. This approach has the disadvantage that part of the circuit is devoted to resistors, contact pads and Zener diodes which are irrelevant to circuit operation after initial circuit adjustment. It is therefore wasteful of integrated circuit material.

It has also been suggested to employ a differential current circuit as a module for insertion in an amplifier to provide current adjustment capability. This is reported by E Sackinger and W Guggenbuhl IEEE J. SC23 1437 (1988), who describe a sub-circuit module suitable for delivering a current of magnitude and polarity required for amplifier adjustment.

An alternative approach has been suggested by L. R. Cartey, IEEE J. SC24 1569 (1989). This involves an amplifier with two input field effect transistors each with a drain load transistor in what is known in the prior art as a "current mirror" arrangement. Carley suggests employing an additional transistor connected in parallel with a drain load transistor and arranged to counteract offset voltage.

All the foregoing prior art techniques for differential amplifier adjustment suffer from the disadvantage that they counteract mis-match by the introduction of asymmetry into the circuit. The traditional long-tailed pair differential amplifier is symmetrical; it has two input circuits which are intended to be identical to one another. The symmetry is lost if resistors and Zener diodes or additional load transistors are used to counteract mis-match. Such prior art techniques allow the amplifier offset voltage to be adjusted and forced to zero for a particular combination of input voltages. However, the average offset voltage over the whole range of amplifier inputs may worsen. That is, the circuit asymmetry degrades the CMRR of the differential amplifier.

SUMMARY OF THE INVENTION

It is an object of the invention to provide an alternative form of differential amplifier and a method of adjusting such an amplifier.

The present invention provides a differential amplifier wherein:

(a) a source-coupled pair of transistors are arranged respectively as inverting and non-inverting input transistors of the amplifier, (b) the input transistors have respective drain load circuits each incorporating a respective subsidiary transistor and the subsidiary transistors forming a pair, characterised in that (c) at least one of the pairs of input and subsidiary transistors is a pair of field effect transistors incorporating respective floating gates and (d) the amplifier includes correcting means for charging at least one of the said floating gates to counteract at least one of:

(i) differing input transistor threshold voltages, and (ii) discrepancies between actual and design values of input transistor drain voltage.

The invention provides the advantage that it is a differential amplifier that is adjustable to counteract mis-match without introducing circuit asymmetry as in the prior art. It is adjusted by charging one or more of the amplifier's transistor floating gates, the charge being retained to provide correction for mis-match.

If at least the input transistors are floating gate field effect transistors, the correcting means may be arranged for charging at least an input transistor floating gate to counteract differing input transistor threshold voltages; the amplifier may also include current varying means connected to input transistor sources and arranged to vary input transistor drain currents. The current varying means may comprise a transistor and biasing means arranged to vary the current in that transistor.

The correcting means may include:

(a) means for controlling the current varying means to determine a linear region of the variation of the amplifier input offset voltage with the square root of the sum of input transistor drain currents, and (b) means for detecting discrepancies between actual and design values of input transistor drain voltage and for charging at least one of the subsidiary transistor floating gates to counteract such discrepancies.

The amplifier may incorporate one or more transistor floating gates which are chargeable as hereinafter discussed.

The correcting means may include a respective terminal pad connected to the or each floating gate designed for charging, the said terminal pad being connectable to a charging source.

An amplifier of the invention may be arranged as an operational amplifier including a second stage connected to a drain load circuit and the correcting means may include means for charging an input transistor floating gate to counteract amplifier input offset voltage.

In an alternative aspect, the invention provides a method of obtaining a mismatch-adjusted differential amplifier including the steps of:

(a) providing a differential amplifier incorporating a pair of input transistors and a pair of drain load transistors, at least one pair being floating gate field effect transistors, and (b) charging at least one floating gate of the field effect transistors to counteract at least one of:

(i) differing input transistor threshold voltages, and (ii) discrepancies between actual and design values of input transistor drain voltage.

The input transistor threshold voltage difference may be determined by determining the amplifier input offset voltage extrapolated to zero input transistor drain current. The threshold voltage difference is then counteracted by charging an input transistor floating gate as appropriate to produce a reduction therein. Discrepancies between actual and design values of input transistor drain voltage may be determined by providing reference signal levels to the input transistors and monitoring the resulting drain voltages. One or both subsidiary transistor floating gates are then charged to reduce the discrepancies. The amplifier of the invention may be an operational amplifier and may incorporate a second stage connected to an input transistor drain, and the amplifier input offset voltage may be determined by feeding back to an amplifier input a signal derived by comparing the second stage output with a reference signal level. The offset voltage is then counteracted by charging an input transistor floating gate to reduce it.

The method of the invention is well suited to iteration to achieve successive approximations to required performance. It also lends itself to automation under computer control as employed in conventional integrated circuit testing.

The invention also extends to an operational amplifier made by the foregoing method.

BRIEF DESCRIPTION OF THE DRAWINGS

In order that the invention might be more fully understood, an embodiment thereof will now be described with reference to the accompanying drawings, in which.

DETAILED DISCUSSION OF PREFERRED EMBODIMENT

Figure 1:
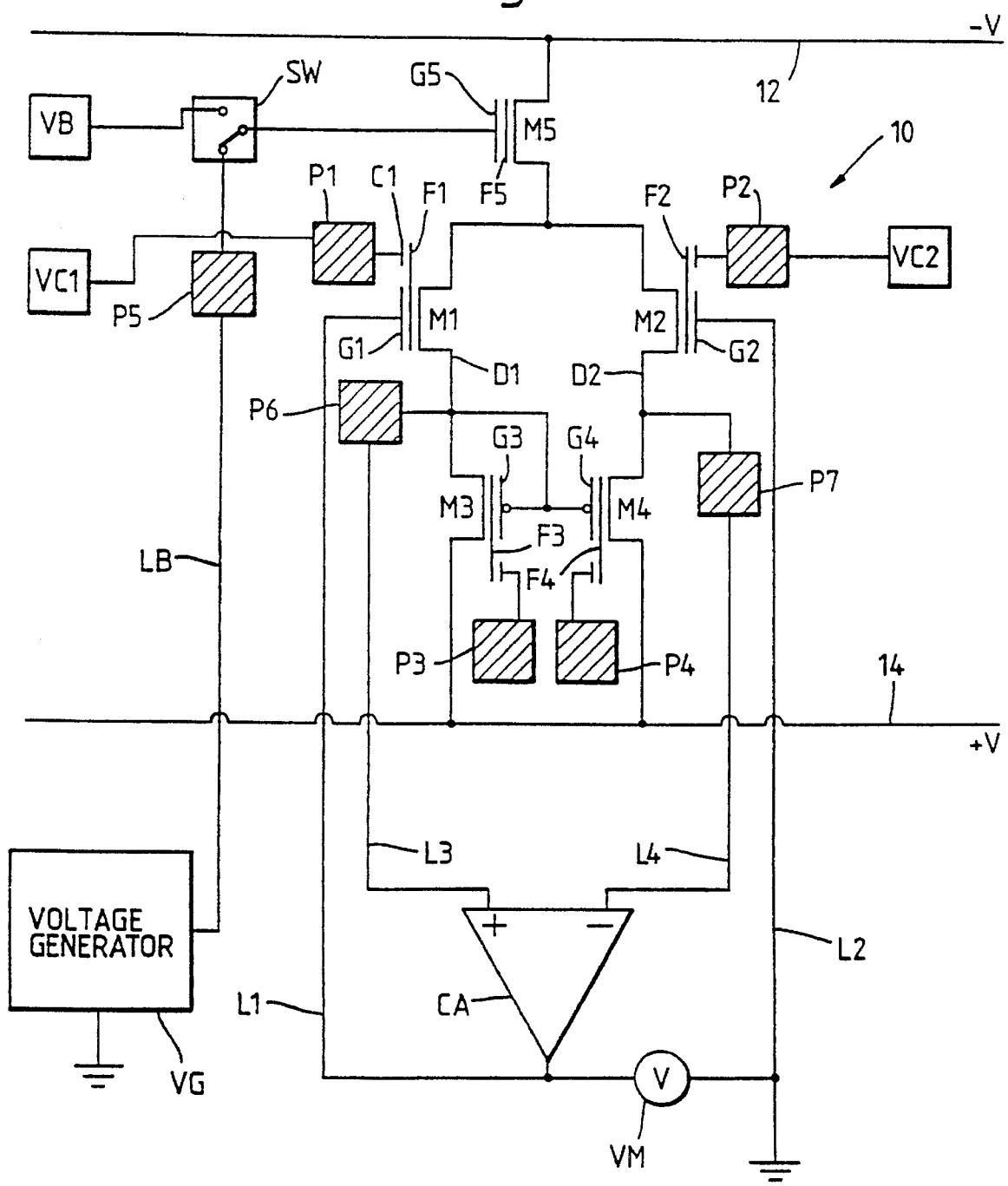
FIG. 1 is a schematic circuit diagram of a differential amplifier of the invention arranged for determination of input transistor threshold voltage difference and its correction.

Referring to FIG. 1, there is shown a differential amplifier of the invention indicated generally by 10. The amplifier 10 incorporates first, second, third, fourth and fifth metal oxide-semiconductor field effect transistors (MOSFETs) M1, M2, M3, M4 and M5 produced by CMOS technology. The MOSFETs M1 to M5 are floating gate devices, generally as outlined by S. M. Sze in "Physics of Semiconductor Devices", 2nd Ed. Wiley 1981, page 496. Each MOSFET Mx consequently has two respective gates, a floating gate Fx and an input gate Gx, where x is 1,2,3,4 or 5. Each floating gate Fx is capable of storing electrical charge for a long period. In IEEE Electron Device Letters, Vol. 12, No 3, March 1991, Thomsen and Brooke estimate that a floating gate in a silicon MOSFET would lose charge at the rate of 0.1% in 26 years.

The first and second MOSFETs M1 and M2 are the input transistors of the differential amplifier 10. They are NMOS devices, and are connected to form a source-coupled pair (long-tailed pair); the fifth MOSFET M5 is also an NMOS device, and is connected as a common source bias element between the M1/M2 pair and a negative power supply line 12. The third and fourth MOSFETs M3 and M4 are PMOS devices, as indicated conventionally by respective circles adjacent their input gates G3 and G4. These MOSFETs M3 and M4 are drain loads for the first and second MOSFETs M1 and M2 respectively; the connections between associated MOSFETs M1/M3 and M2/M4 are drain to drain. The third and fourth MOSFETs M3 and M4 are connected to a positive power supply line 14, and they act in combination as a current mirror circuit.

A current mirror is a known circuit incorporating a MOSFET with gate and drain terminals connected together. In consequence, the gate-source voltage $V_{gs}$ of such a MOSFET reflects the current through it. Moreover, connection together of the gates G3 and G4 of the third and fourth MOSFETs M3 and M4 ensures that these transistors carry like drain currents when biased to an operating regime where current is independent of drain-source voltage $V_{ds}$ provided that their floating gates F3 and F4 have like charging.

The first to fourth floating gates F1 to F4 have capacitative coupling connections (eg C1) to terminal pads P1 to P4 respectively. The fifth MOSFET floating gate F5 has no associated pad. The first and second pads P1 and P2 are connected to respective charging voltage sources VC1 and VC2.

The first and second input gates G1 and G2 are connected by first and second lines L1 and L2 to respective sides of a voltmeter VM. The line L2 is also connected to earth. The third and fourth MOSFET input gates G3 and G4 are connected directly together as has been said. The fifth MOSFET input gate G5 is connected to a single pole, double throw switch SW having poles connected to a bias voltage source VB and to a terminal pad P5. The pad P5 is connected by a line LB to a DC voltage generator VG.

The first and second MOSFETs M1 and M2 have drain connection D1 and D2 connected both to the third and fourth MOSFETs M3 and M4 and to terminal pads P6 and P7 respectively. The pads P6 and P7 are also connected by lines L3 and L4 as input terminals of a comparator amplifier CA.

The differential amplifier 10 is adjusted as follows to correct for differing threshold voltages $V_{T1}$ and $V_{T2}$ of the first and second MOSFETs M1 and M2. The switch SW is set to connect the fifth input gate G5 to the terminal pad P5 and thence to the voltage generator VG. The charging voltage sources VC1 and VC2 are initially isolated (not shown) from the pads P1 and P2. The drain current of the fifth MOSFET M5, and consequently that of each of the first and second MOSFETs M1 and M2, is adjusted by means of the voltage generator VG until the first and second MOSFETs are operating in a saturation regime.

The comparator amplifier CA receives input of the drain voltages of the first and second MOSFETs M1 and M2; it amplifies the difference between these voltages. The amplified difference voltage is fed back to the first input gate G1 with a polarity appropriate to reduce the difference between the first and second MOSFET drain voltages. When feedback has produced a quiescent state, the output voltage from the comparator amplifier CA is that input voltage to the differential amplifier 10 which produces equality between the drain voltages of the first and second MOSFETs M1 and M2; this input voltage is defined as the offset voltage $V_{OS}$, and it is shown by the voltmeter VM.

The difference $\delta V_{T12}$ between the threshold voltages $V_{T1}$ and $V_{T2}$ of the first and second MOSFETs M1 and M2 is determined by a graphical extrapolation technique. When $\delta_{VT12}$ has been determined, it is reduced by applying a charge of the appropriate polarity to one of the first and second floating gates F1 and F2 by means of the respective charging voltage sources VC1 or VC2. The graphical and charging techniques are described in more detail below. The reduced value of $\delta V_{T12}$ is determined by the graphical technique once more, and is further reduced by altering the charge previously applied to the floating gate F1 and F2. The procedure is repeated iteratively until the residual value of $\delta V_{T12}$ is sufficiently small to be negligible for the purpose for which the amplifier 10 is intended.

The graphical extrapolation technique referred to above is derived as follows: the offset voltage $V_{OS}$ (shown on the voltmeter VM in FIG. 1) has been analysed for a source-coupled pair of MOSFETs by P R Gray and R G Meyer in "Analysis and Design of Analog Integrated Circuits", Second Edition, John Wiley and Sons 1984. From that analysis, it can be shown that, if the first, second and fifth MOSFETs M1, M2 and M5 are operating in saturation, then approximately:

$$V_{OS} = \delta V_{T12} + A[I_{DS}]^{1/2} \qquad (1)$$

where $IO_5$ is the drain current of the fifth MOSFET M5, and A is a constant. Equation (1) is an approximate relationship which arises because $V_{OS}$ is related to the drain currents of the first and second MOSFETs M1 and M2, and these currents are approximately equal to each other and to $I_{DS}/2$.

However, in saturation, $$I_{DS} = [V_{GS5} - V_{T5}]^2 \qquad (2)$$

where $V_{GS5}$ and $V_{T5}$ are the fifth MOSFET's gate-source voltage and threshold voltage respectively.

Combining (1) and (2):

$$V_{OS} = \delta V_{T12} + B(V_{GS5} - V_{T5}) \qquad (3)$$

where B is a constant.

Equation (3) shows that the variation of $V_{OS}$ as a linear function of the square root $[I_{DS}]^{1/2}$ of the sum of the first and second MOSFETs' drain currents can be replaced by a like variation with $(V_{GS5} - V_{T5})$.

A typical value for a MOSFET threshold voltage $V_T$ is 0.85V, and this value may be employed to replace $V_{T5}$ in Equations (3) with a degree of error that is negligible.

$V_{GS5}$ is the voltage difference between the voltages on the line LB and the negative power supply line 12, and is controlled by the voltage generator VG. As has been said, $V_{OS}$ is measured by the voltmeter VM. From Equation (3), a graph of $V_{OS}$ against $(V_{GS5} - V_{T5})$ produces a straight line of slope B. This line has an intercept on the $V_{OS}$ axis of $\delta V_{T12}$, the difference between the threshold voltages $V_{T1}$ and $V_{T2}$ of the first and second MOSFETs M1 and M2. The graph is produced by connecting the fifth MOSFET gate G5 to the voltage generator VG, varying the generator output voltage. This produces a variation in $V_{OS}$ on the voltmeter VM.

Figure 2:
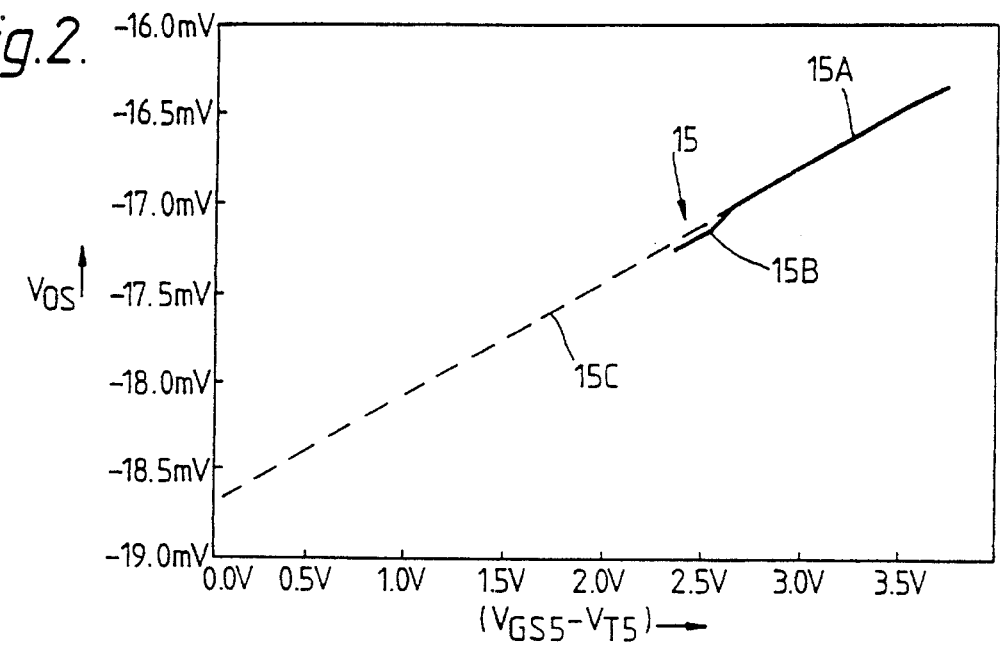
FIG. 2 is a graph of amplifier offset voltage against gate-source voltage minus threshold voltage of a transistor arranged to control amplifier drain current.

Referring now also to FIG. 2, there is shown a graph 15 of $V_{OS}$ against $(V_{GS5} - V_{T5})$. The graph has a linear portion 15A and a curved portion 15B; the latter arises from departures from the assumptions on which Equations (1) to (3) were based. The linear portion 15A is extrapolated by a chain line 15C to an intercept $\delta V_{T12}$ of −18.7 mV on the $V_{OS}$ axis. The graph 15 indicates that the first MOSFET M1 has a threshold voltage $V_{T1}$ 18.7 mV below that of the second MOSFET M2.

In order to counteract the threshold voltage difference, a charge is applied to one of the floating gates F1 and F2 and the procedure used to generate the graph 15 is repeated. If the value of $\delta V_{T12}$ increases, the polarity of the charge is reversed and the procedure repeated. If $\delta V_{12}$ is reduced, the procedure is repeated with a charge of like polarity and lesser or greater magnitude in accordance with whether the reduction was greater than or less than $\frac{1}{2}\delta V_{T12}$. Successive iterations of this procedure provide a negligible residual threshold voltage difference.

Charge is introduced on to the relevant floating gate F1 or F2 as described by A Thomsen and M A Brooke, IEEE Electron Device Letters, Vol. 12, No. 3, March 1991. The terminal pads P1 to P4 are capacitively coupled to respective floating gates F1 to F4; each capacitive coupling is however constructed as a charge injector as described by Thomsen et al. In consequence, a voltage on one of the pads P1 to P4 produces the injection of charge on to the associated gate F1, F2, F3 or F4. The charge remains on the relevant gate after the voltage is removed from the associated pad, and persists for a considerable time as has been said.

Figure 3:
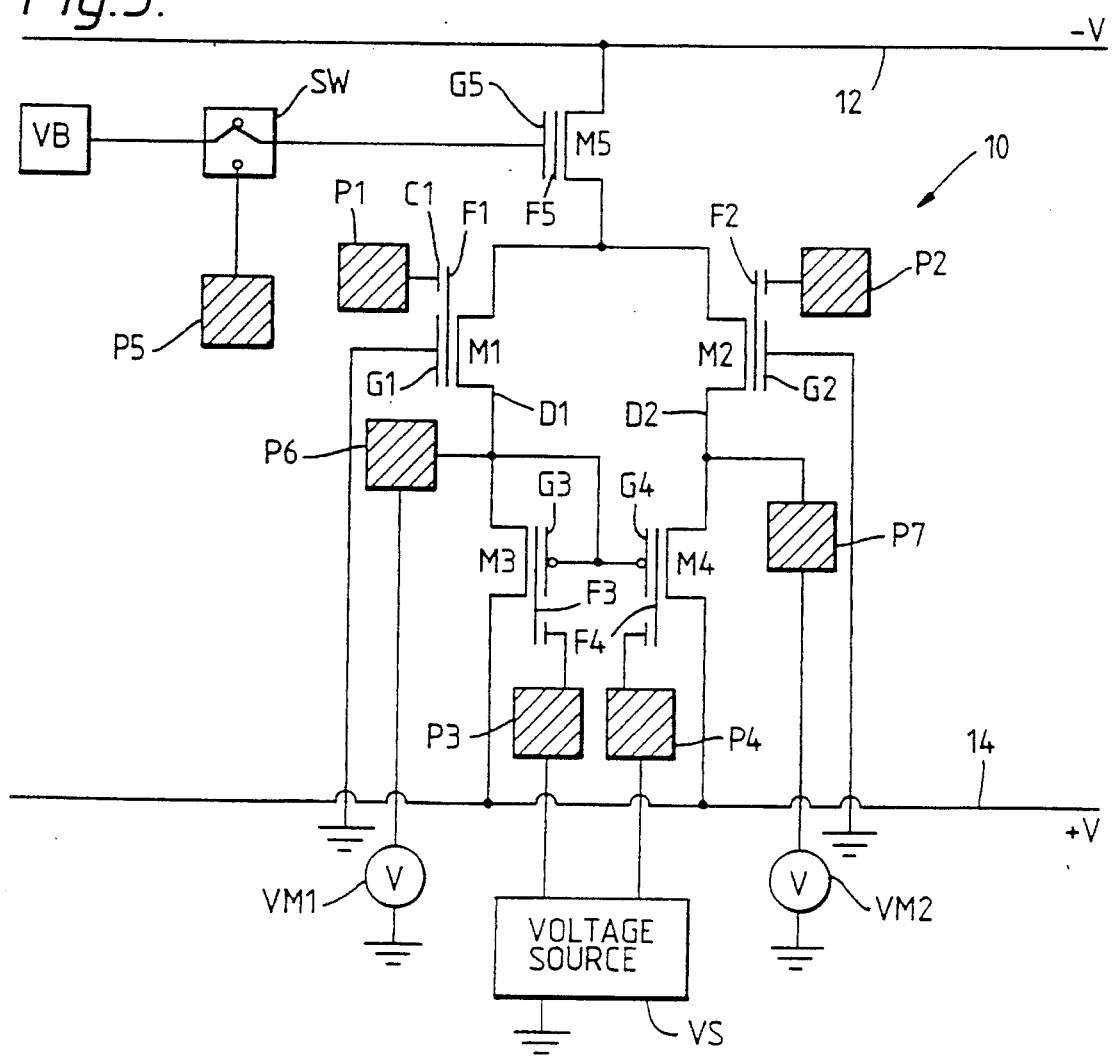
FIG. 3 shows the amplifier of FIG. 1 arranged for determination and adjustment of discrepancies between actual and design values of amplifier output voltage.

Referring now to FIG. 3, there is shown the differential amplifier 10 of FIG. 1 with changes to subsidiary circuitry for the purposes of determining charges to be applied to the third and fourth MOSFETs M3 and M4. Parts previously described are like referenced. The differential amplifier 10 has first and second input gates G1 and G2 connected to earth. The terminal pads P6 and P7 are connected to first and second voltmeters VM1 and VM2 respectively, which are also connected to earth. Terminal pad P5 is unconnected. The third and fourth terminal pads P3 and P4 are connected to a variable voltage source VS. The switch SW is set to connect the fifth input gate G5 to the bias voltage source VB.

The voltage source VS is employed to apply voltages to the third and fourth pads P3 and P4, so that charges are injected on to the third and fourth floating gates F3 and F4. This alters the drain voltages of the first and second MOSFETS M1 and M2 to respective predetermined values for which the amplifier 10 was designed. The drain voltages appear at the sixth and seventh pads P6 and P7 respectively, and are measured by the first and second voltmeters VM1 and VM2. When the predetermined values are achieved, the voltage source VS is disconnected from the pads P3 and P4. This leaves charges on third and fourth floating gates appropriate for maintaining the design values of the first and second MOSFET drain voltages.

Figure 4:
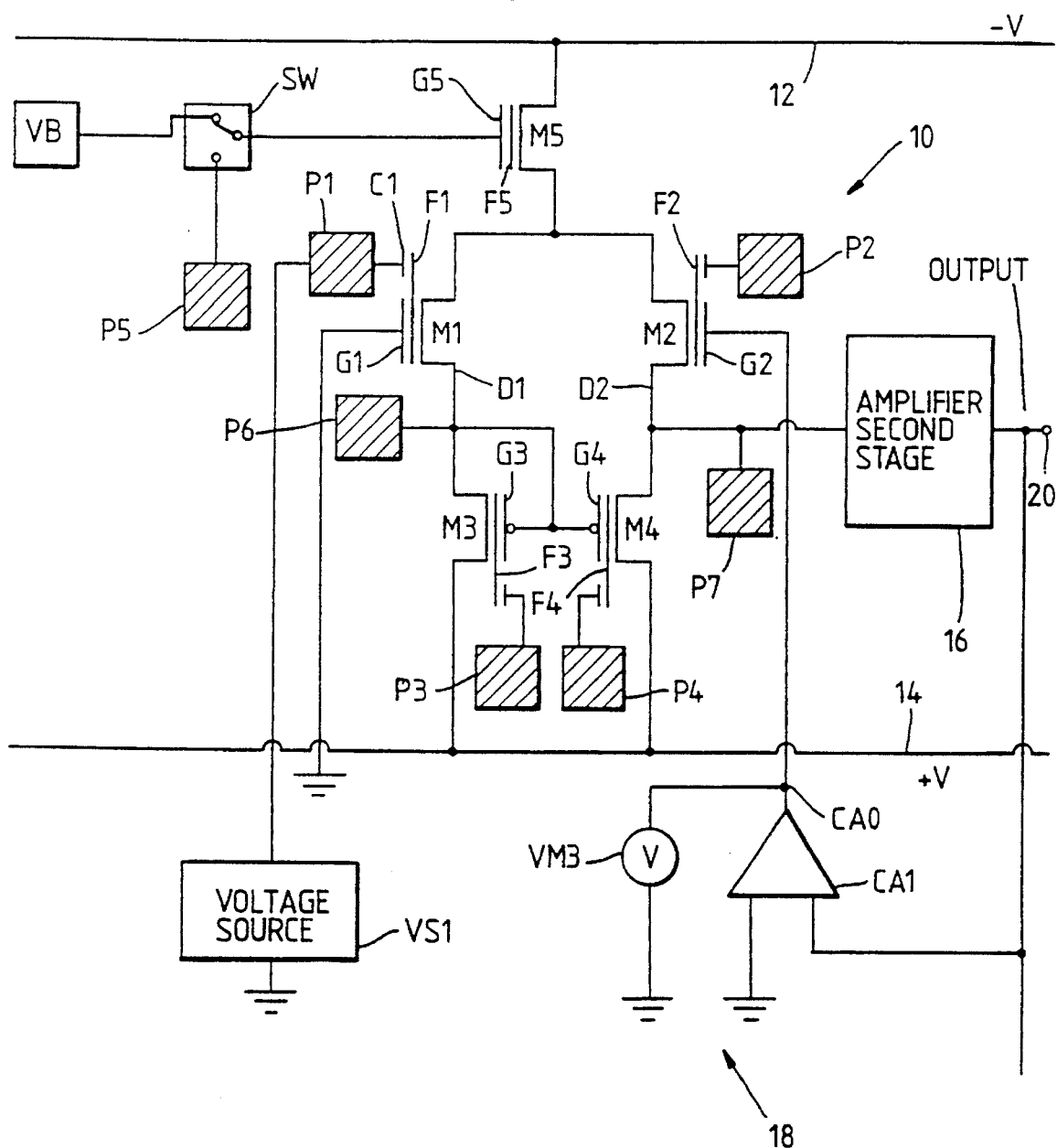
FIG. 4 shows the amplifier of FIGS. 1 and 3 arranged as part of an operational amplifier in which amplifier input offset voltage is to be corrected.

Referring now to FIG. 4, there is shown the differential amplifier 10 arranged as an input stage of an operational amplifier 18 having a second stage 16. The second stage 16 has an output 20 which is also the operational amplifier output and is connected as one input to a comparator amplifier CA1. A voltmeter VM3 is connected between earth and an output CA0 of the comparator amplifier CA1, and this amplifier has earth as a second input. The amplifier output CA0 is connected to the second input gate G2. A voltage source VS1 is connected to the first floating gate terminal pad P1. The first input gate G1 is connected to earth.

The circuit of FIG. 4 operates as follows. The first input gate G1 is at earth potential. The signal at the second drain connection D2 is connected to the second stage 16. The output signal from the second stage 16 is compared with earth potential in the comparator amplifier CA1. Output CA0 from the comparator amplifier CA1 is fed to the second input gate G2, and has a polarity appropriate to reduce the output voltage appearing at the operational amplifier output 20. In consequence, negative feedback takes place in the loop defined by the differential amplifier 10, the second stage 16 and the comparator amplifier CA1. When this feedback loop stabilises, the output voltage of the comparator amplifier CA1 is that which is necessary to produce a zero voltage at the operational amplifier output 20. This comparator output voltage is the systematic input offset voltage of the two-stage operational amplifier 18 determined over both amplifier stages 10 and 16. It appears displayed on the voltmeter VM3. To adjust the operational amplifier 18 for zero systematic input offset voltage, either the first floating gate F1 or alternatively the second floating gate F2 is charged as appropriate to reduce the voltage shown on the voltmeter VM3. The procedure involving charge injection is iterative and equivalent to that described with reference to FIG. 1.

The invention lends itself to automation of the kind employed for conventional integrated circuit testing. Thus the terminal pads P1 to P7 may be designed to accept probes linked to a computer with associated voltage sources and measuring devices, the computer being programmed to implement supply and detection of voltages and to activate floating gate charging. Such an arrangement is well suited to iterative procedures and to adjustment of arrays of amplifiers.

The current mirror drain load circuit of the differential amplifier 10 may be replaced by any other drain load circuit having a respective floating gate transistor for each input transistor. Variation of the drain currents of the first and second MOSFETs M1 and M2 may be achieved by a current source connected in parallel with a bias element such as the fifth MOSFET M5, the source being disconnectable after adjustment of $\delta V_{T12}$ to a low value.

The invention has been described with reference to adjustment to counteract differing threshold voltages and departures from design values of input transistor drain voltages, and also input offset voltage when the differential amplifier is part of an operational amplifier. However, in individual applications of the invention not all of these adjustments may be required. Any one, any two or all three might be appropriate according to circuit design requirements in specific circumstances. In some operational amplifier applications in particular input voltage offset adjustment may be unnecessary.

The differential amplifier 10 incorporated a respective terminal pad (eg P1) for each of the four MOSFETs M1 to M4. It would be possible for the invention to be implemented with only one of the first and second MOSFETs M1 and M2 having a terminal pad. Since a floating gate may be charged positive or negative, a correction requiring a positive charge on floating gate F1 may be implemented by a negative charge on floating gate F2. However, this introduces circuit design asymmetry which might not be acceptable.

I claim:

1. A differential amplifier comprising:
    (a) a source-coupled pair of transistors arranged respectively as inverting and non-inverting input transistors of the amplifier,
    (b) a pair of subsidiary transistors each connected as a drain load of a respective input transistor,
    (c) at least one of the pairs of input and subsidiary transistors comprises a pair of field effect transistors incorporating respective floating gates, and
    (d) the amplifier includes correcting means for storing charge upon at least one of said floating gates by charge injection to counteract at least one of:
        (i) differing input transistor threshold voltages, and
        (ii) discrepancies between actual and design values of input transistor drain voltage.

2. The amplifier according to claim 1 wherein the correcting means corrects differing input transistor threshold voltages, and wherein the amplifier includes current varying means connected to the input transistor sources and arranged to vary the input transistors' drain currents.

3. The amplifier according to claim 2 wherein the current varying means comprises a transistor and biasing means arranged to vary the current in that transistor.

4. The amplifier according to claim 2 wherein the correcting means includes:
    (a) means for controlling the current varying means to determine a linear region of the variation of the amplifier offset voltage with the square root of the sum of input transistor drain currents, and
    (b) means for detecting discrepancies between actual and design values of input transistor drain voltage and for storing charge on at least one of the subsidiary transistor floating gates to counteract such discrepancies.

5. The amplifier according to claim 1 wherein the correcting means includes a respective terminal pad connected to said at least one floating gate, said terminal pad being connectable to a charging source.

6. An amplifier according to claim 1 wherein said amplifier comprises an operational amplifier including a second stage connected to a drain load circuit, the correcting means including means for storing charge on an input transistor floating gate to counteract amplifier input offset voltage.

7. A method of reducing mismatch in a differential amplifier comprising the steps of:
   (a) incorporating a pair of input transistors and a pair of drain load transistors, at least one pair of transistors comprising field effect transistors with floating gates, and
   (b) storing charge on at least one floating gate by charge injection to counteract at least one of:
      (i) differing input transistor threshold voltages, and
      (ii) discrepancies between actual and design values of input transistor drain voltage.

8. A method according to claim 7 wherein prior to the step of storing charge, the input transistor threshold voltage difference is determined by measuring the amplifier input offset voltage as a linear function of the square root of the sum of the input transistor drawing currents and extrapolating that voltage to zero drain current sum, and differing input transistor threshold voltages are corrected by charging an input transistor floating gate.

9. The method according to claim 7 wherein discrepancies between actual and design values of input transistor drain voltage are determined by providing reference signal levels to the input transistors and monitoring the input transistor drain voltages which result, and at least one of the drain load transistors has a floating gate upon which charge is stored to counteract any discrepancy.

10. The method according to claim 7 wherein the amplifier has a second stage connected to an input transistor drain, the amplifier has an input offset voltage which is determined by feeding back to an amplifier input a signal derived by comparing the second stage output with a reference signal level, and said input offset voltage is counteracted by storing charge on an input transistor floating gate to reduce 11. The method according to claim 7 wherein the differential amplifier is part of an operational amplifier.

12. A differential amplifier comprising:
   (a) a source-coupled pair of floating gate field effect transistors arranged respectively as inverting and non-inverting input transistors of the amplifier,
   (b) a pair of subsidiary floating gate field effect transistors each connected as a drain load of a respective input transistor, and
   (c) correcting means for storing charge upon at least one of said floating gates of each of said pairs of transistors by charge injection to counteract differing input transistor threshold voltages and discrepancies between actual and design values of input transistor drain voltage.

13. The amplifier according to claim 12 wherein the correcting means includes a respective terminal pad connected to the or each floating gate upon which charge is to be stored, said terminal pad being connectable to a charging source.

14. The amplifier according to claim 12 arranged as an operational amplifier including a second stage connected to a drain load circuit, the correcting means including means for storing charge upon an input transistor floating gate to counteract amplifier input offset voltage.

15. A method of reducing mismatch in a differential amplifier incorporating four floating gate field effect transistors arranged as two input transistors connected to two drain load transistors, including the step of storing charge upon the floating gates of at least some of the transistors by charge injection to counteract differing input transistor threshold voltages and discrepancies between actual and design values of input transistor drain voltage.

* * * * *